(12) United States Patent
Brunnbauer et al.

(10) Patent No.: US 8,330,273 B2
(45) Date of Patent: Dec. 11, 2012

(54) SEMICONDUCTOR DEVICE INCLUDING MOLDING COMPOUND LAYER FORMS A COMMON PLANE WITH THE SURFACE OF THE SEMICONDUCTOR CHIP

(75) Inventors: Markus Brunnbauer, Lappersdorf (DE); Jens Pohl, Bernhardswald (DE); Rainer Steiner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/904,628

(22) Filed: Oct. 14, 2010

(65) Prior Publication Data

US 2011/0024915 A1 Feb. 3, 2011

Related U.S. Application Data

(62) Division of application No. 11/749,293, filed on May 16, 2007, now Pat. No. 7,863,088.

(51) Int. Cl.
*H01L 23/12* (2006.01)
*H01L 23/48* (2006.01)
*H01L 23/52* (2006.01)
*H01L 29/40* (2006.01)

(52) U.S. Cl. .......................... 257/739; 257/774; 257/777

(58) Field of Classification Search .................. 257/739, 257/774, 777, E23.178
See application file for complete search history.

(56) References Cited

U.S. PATENT DOCUMENTS

| 6,180,881 | B1 | 1/2001 | Isaak |
| 6,822,324 | B2 | 11/2004 | Tao et al. |
| 7,057,290 | B2 | 6/2006 | Sunohara et al. |
| 7,459,729 | B2 | 12/2008 | Yang et al. |
| 7,545,047 | B2 | 6/2009 | Bauer et al. |
| 2003/0006494 | A1 | 1/2003 | Lee et al. |
| 2003/0137045 | A1 | 7/2003 | Sugaya et al. |
| 2004/0232543 | A1 | 11/2004 | Goller et al. |
| 2005/0161833 | A1 | 7/2005 | Takeuchi et al. |
| 2006/0087037 | A1 | 4/2006 | Hsu |
| 2006/0208356 | A1 | 9/2006 | Yamano et al. |
| 2006/0211233 | A1 | 9/2006 | Gan et al. |
| 2007/0158787 | A1 | 7/2007 | Chanchani |
| 2008/0029890 | A1 | 2/2008 | Cheng |
| 2008/0157336 | A1* | 7/2008 | Yang ........................ 257/690 |

FOREIGN PATENT DOCUMENTS

| DE | 102004013770 A1 | 5/2005 |
| DE | 10 2004 022 884 | 12/2005 |
| DE | 102005043557 A1 | 9/2006 |
| DE | 69315451 T2 | 10/2010 |
| EP | 1424731 A2 | 6/2004 |

OTHER PUBLICATIONS

M. Brunnbauer et al., "Embedded Wafer Level Ball Grid Array (eWLB)", 2006 Electronics Packaging Technology Conference, IEEE (2006), pp. 1-5.

* cited by examiner

*Primary Examiner* — William M. Brewster
(74) *Attorney, Agent, or Firm* — Dicke, Billig & Czaja, PLLC

(57) ABSTRACT

A semiconductor device and method is disclosed. In one embodiment, the method includes placing a first semiconductor over an electrically conductive carrier. The first semiconductor is covered with a molding compound. A through hole is formed in the molding compound. A first material is deposited in the through hole.

23 Claims, 6 Drawing Sheets

SEMICONDUCTOR DEVICE INCLUDING MOLDING COMPOUND LAYER FORMS A COMMON PLANE WITH THE SURFACE OF THE SEMICONDUCTOR CHIP

CROSS-REFERENCE TO RELATED APPLICATIONS

This Utility Patent Application is a divisional application of U.S. application Ser. No. 11/749,293, filed May 16, 2007, now U.S. Pat. No. 7,863,088, which is incorporated herein by reference.

BACKGROUND

This invention relates to semiconductor devices and methods to manufacture semiconductor devices.

For high system integration it is useful to stack integrated circuits, sensors, micromechanical apparatuses or other devices on top of each other. In order to be able to electrically connect the stacked devices, it may be useful for at least some of the stacked devices to be provided with electrically conductive feedthroughs from their top surface to their bottom surface.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
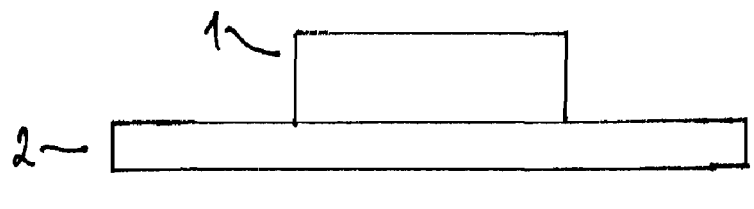
FIGS. 1A to 1D schematically illustrate a method to produce a device as an exemplary embodiment.
Figure 1B:
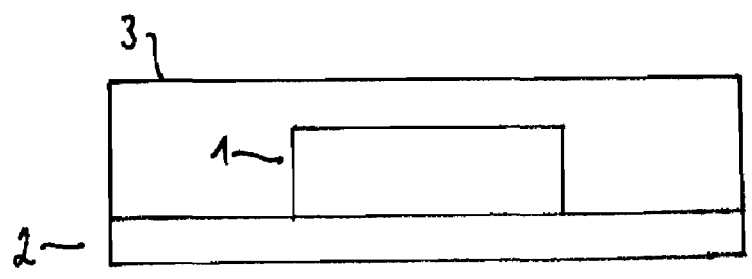
Figure 1C:
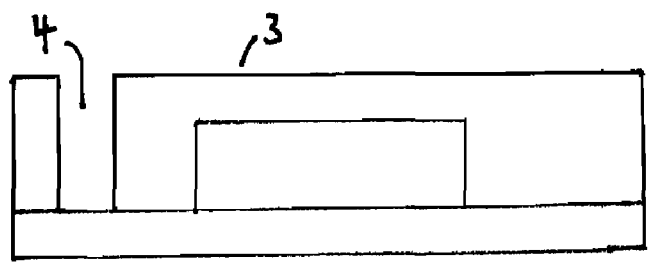

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Devices with a semiconductor chip embedded in a molding compound are described below. The semiconductor chips may be of extremely different types and may include for example integrated electrical or electro-optical circuits. The semiconductor chips may be configured as MEMS (micro-electro mechanical systems) and may include micro-mechanical structures, such as bridges, membranes or tongue structures. The semiconductor chips may be configured as sensors or actuators, for example pressure sensors, acceleration sensors, rotation sensors, microphones etc. Semiconductor chips in which such functional elements are embedded generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

The semiconductor chips have contact pads which allow electrical contact to be made with the semiconductor chip. The contact pads may be composed of any desired electrically conductive material, for example of a metal, such as aluminum, gold or copper, a metal alloy or an electrically conductive organic material. The contact pads may be situated on the active surfaces of the semiconductor chips or on other surfaces of the semiconductor chips.

One or more wiring layers may be applied to the semiconductor chips. The wiring layers may be used to make electrical contact with the semiconductor chips from outside the devices. The wiring layers may be manufactured with any desired geometric shape and any desired material composition. The wiring layers may, for example, be composed of linear conductor tracks, but may also be in the form of a layer covering an area. Any desired electrically conductive materials, such as metals, for example aluminum, gold or copper, metal alloys or organic conductors, may be used as the material. The wiring layers need not be homogenous or manufactured from just one material, that is to say various compositions and concentrations of the materials contained in the wiring layers are possible. Furthermore, the wiring layers may be arranged above or below or between dielectric layers.

The devices described in the following include a molding compound covering at least parts of the semiconductor chips. The molding compound may be any appropriate thermoplastic or thermosetting material. Various techniques may be employed to cover the semiconductor chips with the molding compound, for example compression molding or injection molding.

Figure 1D:
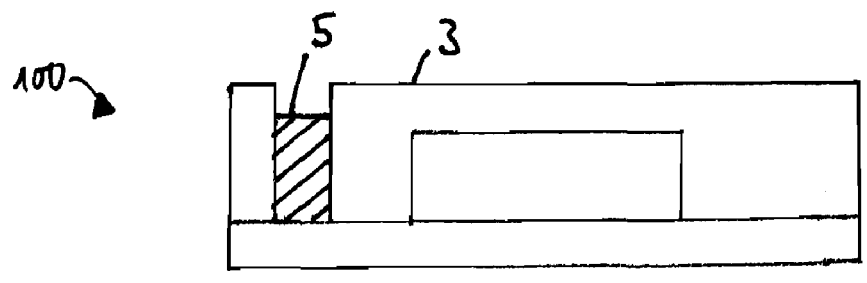

FIGS. 1A to 1D schematically illustrate a method for production of a device 100, a cross section of which is illustrated in FIG. 1D. As illustrated in FIG. 1A, a first semiconductor chip 1 is placed over an electrically conductive carrier 2. The first semiconductor chip 1 is covered with molding compound 3 (see FIG. 1B). In the molding compound 3 a through hole 4 is formed (see FIG. 1C), and in the through hole 4 a first material 5 is deposited (see FIG. 1D). The first material 5 may, for example, be a metal and may be deposited in the through hole 4 galvanically. During the galvanic deposition of the first material 5 the electrically conductive carrier 2 may be used as an electrode. The first material 5 may fill the through hole 4 completely or only partly.

Figure 2A:
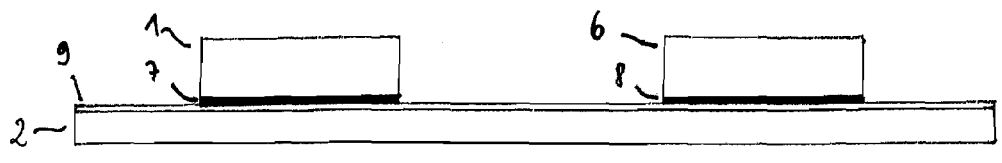
FIGS. 2A to 2I schematically illustrate a method to produce devices as a further exemplary embodiment.
Figure 2B:
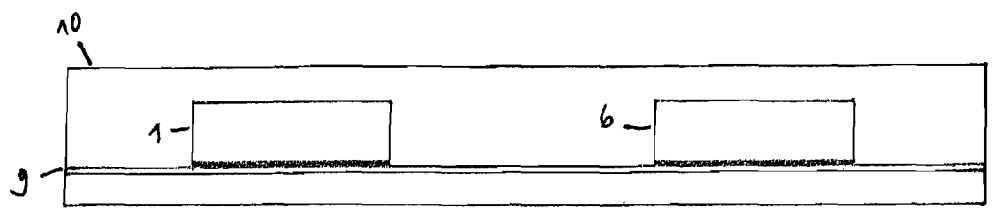
Figure 2C:
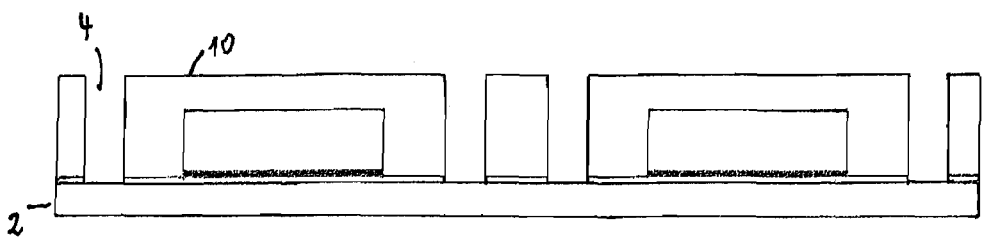
Figure 2D:
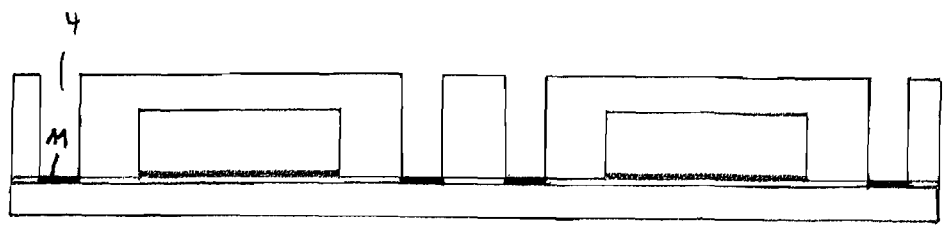
Figure 2E:
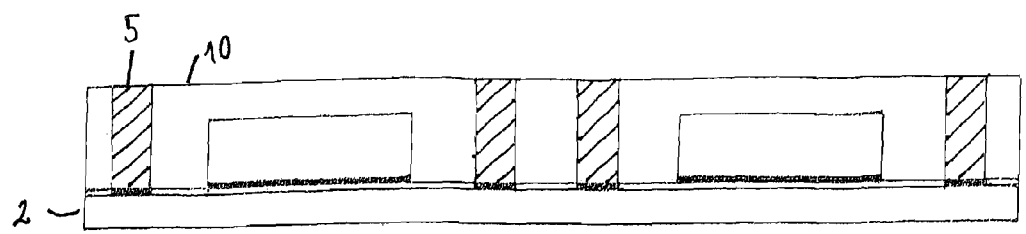
Figure 2F:
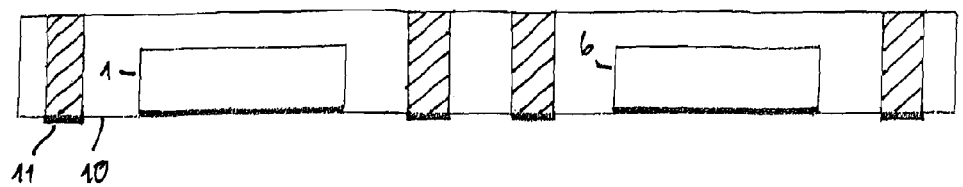
Figure 2G:
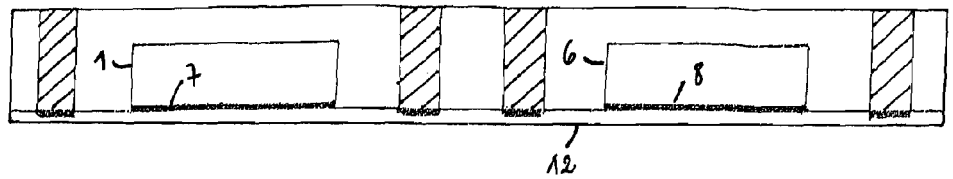
Figure 2H:
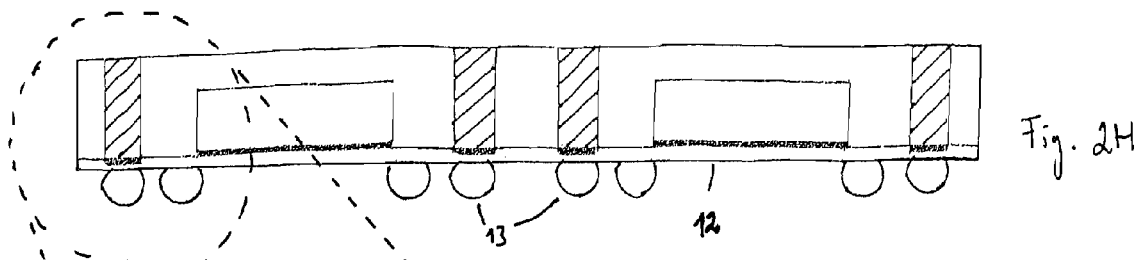
Figure 2I:
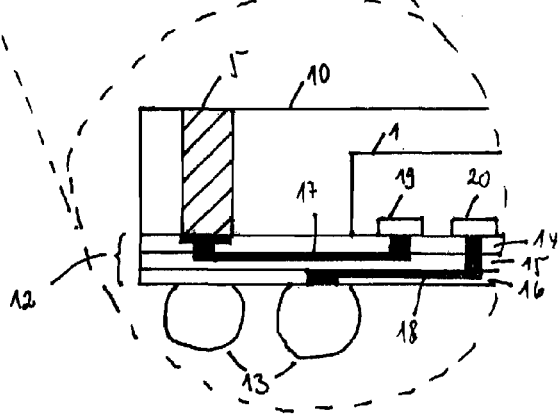
Figure 2I:
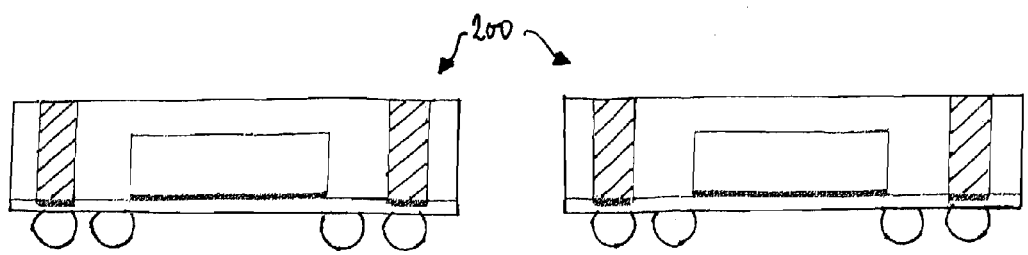

FIGS. 2A to 2I schematically illustrate a method for production of devices 200, cross sections of which are illustrated in FIG. 2I. The method illustrated in FIGS. 2A to 2I is a development of the method illustrated in FIGS. 1A to 1D. The details of the production method that are described below can therefore be likewise applied to the method of FIGS. 1A to 1D.

As illustrated in FIG. 2A, the first semiconductor chip 1 and a second semiconductor chip 6 as well as possibly further semiconductor chips are placed over the electrically conductive carrier 2. The carrier 2 may be a plate made of a metal, for example nickel, steel or stainless steel. The semiconductor chips 1 and 6 may have been fabricated on a wafer made of semiconductor material. After dicing the wafer and thereby separating the individual semiconductor chips 1 and 6, the semiconductor chips 1 and 6 are relocated on the carrier 2 in larger spacing as they have been in the wafer bond. The semiconductor chips 1 and 6 may have been manufactured on the same wafer, but may alternatively have been manufactured on different wafers. Furthermore, the semiconductor chips 1 and 6 may be physically identical, but may also contain different integrated circuits. The semiconductor chips 1 and 6 have active main surfaces 7 and 8, respectively, and may be arranged over the carrier 2 with their active surfaces 7 and 8 facing the carrier 2.

Before the semiconductor chips 1 and 6 are placed over the carrier 2, an adhesive tape 9, for example a double sided sticky tape, may be laminated on the carrier 2. The semiconductor chips 1 and 6 can be fixed on the adhesive tape 9. For attaching the semiconductor chips 1 and 6 to the carrier 2, other kinds of attaching materials may alternatively be used.

After the semiconductor chips 1 and 6 were mounted on the carrier 2, they are encapsulated by molding using a thermoplastic or thermosetting molding compound 10 (see FIG. 2B). The gaps between the semiconductor chips 1 and 6 are also filled with the molding compound 10. The thickness of the molding compound layer 10 may be in the range from 100 to 300 μm, but may also be thicker than 300 μm.

As illustrated in FIG. 2C, through holes 4 are formed in the molding compound layer 10. The through holes 4 reach from the top surface of the molding compound layer 10 down to the surface of the carrier 2. The through holes 4 extend through the adhesive tape 9. The through holes 4 may be drilled using a laser beam, a mechanical drill, an etching method or any other appropriate method. When using a laser beam, the laser beam may have a conical geometry. Therefore the angle between the top surface of the molding compound layer 10 and the side walls of the through holes 4 may deviate from 90°. The aspect ratio of the through holes 4, which is the ratio of their widths to their lengths, may be in the range from 1:1 to 1:5 and in particular from 1:2 to 1:3. The through holes 4 may be spaced apart from each other in the range from 400 to 500 μm, but other spacings are also possible.

In the through holes 4 a layer of solder material 11 or any other appropriate material is deposited (see FIG. 2D). The solder material 11 may be formed from metal alloys which are composed, for example, from the following materials: SnPb, SnAg, SnAgCu, SnAgCuNi, SnAu, SnCu and SnBi. The solder layers 11 may, for example, be applied to the carrier 2 by galvanic plating.

After the deposition of the solder material 11 the through holes 4 are filled with the first electrically conductive material 5, which may be a metal, such as copper, aluminum or gold, or a metal alloy, such as SnAg or SnAu. The first material 5 may be in direct contact with the molding compound 10. Filling the through holes 4 with the first material 5 may be carried out by using a galvanic method or any other appropriate deposition method. When the first material 5 is galvanically deposited, the carrier 2 together with the semiconductor chips 1 and 6 as well as the molding compound layer 10 may be dipped into an electrolyte solution containing the first material 5 or, alternatively, the electrolyte solution may be poured over the top surface of the molding compound layer 10. Furthermore, an appropriate voltage is applied between the electrically conductive carrier 2 and at least one further electrode which is placed in the electrolyte solution. The voltage between the carrier 2 and the further electrode is set such that the first material 5 precipitates at the bottom of the through holes 4. In this case the electrically conductive carrier 2 functions as an electrode for the galvanic deposition of the first material 5. In the present embodiment the galvanic deposition process is stopped once the through holes 4 are completely filled with the first material 5 (see FIG. 2E). After the deposition of the first material 5, the electrically conductive first material 5 forms vias in the molding compound layer 10.

The semiconductor chips 1 and 6 covered with the molding compound 10 are released from the carrier 2, and the adhesive tape 9 is pealed from the semiconductor chips 1 and 6 as well as from the molding compound layer 10 (see FIG. 2F). The adhesive tape 9 features thermo-release properties, which allow the removal of the adhesive tape 9 during a heat-treatment. The removal of the adhesive tape 9 from the carrier 2 is carried out at an appropriate temperature, which depends on the thermo-release properties of the adhesive tape 9 and is usually higher than 150° C., in particular approximately 200° C. Furthermore, when releasing the adhesive tape 9 from the carrier 2, the layers of solder material 11 define the breaking points where the vias through the molding compound layer 10 come off from the carrier 2. In order to facilitate the release of the solder material 11 from the carrier 2, the carrier 2 may be heated up to the melting temperature of the solder material 11.

After the release of the carrier 2 and the adhesive tape 9 the active surfaces 7 and 8 of the semiconductor chips 1 and 6 as well as the bottom surface of the molding compound layer 10 form a common plane. As illustrated in FIG. 2G, a redistribution layer 12 is applied to this common plane. Subsequently, external contact elements 13 are applied to the redistribution layer 12 as illustrated in FIG. 2H.

In order to illustrate the structure and the function of the redistribution layer 12, a part of the redistribution layer 12 is enlarged in FIG. 2H. In the present embodiment, the redistribution layer 12 includes three dielectric layers 14, 15 and 16 as well as two electrically conductive layers in the form of wiring layers 17 and 18. The dielectric layer 14 is deposited on the common plane formed by the main surfaces 7 and 8 of the semiconductor chips 1 and 6 and the molding compound layer 10. The wiring layer 17 is applied to the dielectric layer 14, with an electrical contact being produced between a contact pad 19 that is embedded in the active main surface 7 and the wiring layer 17 at one point and a further electrical contact between the via formed by the first material 5 and the wiring layer 17 at another point. The dielectric layer 14 has openings in order to produce these contacts.

The dielectric layer 15, the wiring layer 18 and the dielectric layer 16 are subsequently applied to the wiring layer 17. The dielectric layers 14 and 15 have openings in order to allow an electrical contact between a contact pad 20 embedded in the active main surface 7 and the wiring layer 18. The dielectric layer 16 is opened in areas in which the external contact elements 13 are arranged. Instead of two wiring layers, it is also possible to use only one wiring layer or, alternatively, more than two wiring layers if required.

The dielectric layers 14 to 16 may be fabricated in various ways. For example, the dielectric layers 14 to 16 can be deposited from a gas phase or from a solution, or can be laminated onto the semiconductor chips 1 and 6. Furthermore, thin-film technology methods can be used for application of the dielectric layers 14 to 16. Each of the dielectric layers 14 to 16 may be up to 10 µm thick. In order to make electrical contacts with the wiring layers 17 and 18, the dielectric layers 14 to 16 may, for example, be opened by using photolithographic methods and/or etching methods. The wiring layers 17 and 18 may, for example, be fabricated by metallization followed by structuring of the metallization layer.

The external contact elements 13 may have the form of solder deposits. The solder material may be formed from metal alloys which are composed, for example, from the following materials: SnPb, SnAg, SnAgCu, SnAgCuNi, SnAu, SnCu and SnBi. The solder deposits 13 may be applied to the redistribution layer 12 by "ball placement", in which pre-shaped balls 13 composed of solder material are applied to the exposed contact pads in the wiring layer 18. As an alternative to "ball placement", the solder balls 13 may, for example, be applied by using template printing with a solder paste, followed by a heat-treatment process, or by galvanic plating followed by an optional heat-treatment process.

The molding compound layer 10 allows the redistribution layer 12 to extend beyond the semiconductor chips 1 and 6. The external contact elements 13 therefore do not need to be arranged in the area of the semiconductor chips 1 and 6 but can be distributed over a larger area. The increased area which is available for arrangement of the external contact elements 13 as a result of the molding compound layer 10 means that the external contact elements 13 can not only be placed at a great distance from one another, but that the maximum number of external contact elements 13 which can be placed there is likewise increased compared to the situation when all the external contact elements 13 are placed within the area of the main surfaces 7 and 8 of the semiconductor chips 1 and 6.

As illustrated in FIG. 2I, the two semiconductor chips 1 and 6 are separated from one another by separation of the molding compound layer 10, for example by sawing.

Figure 3A:
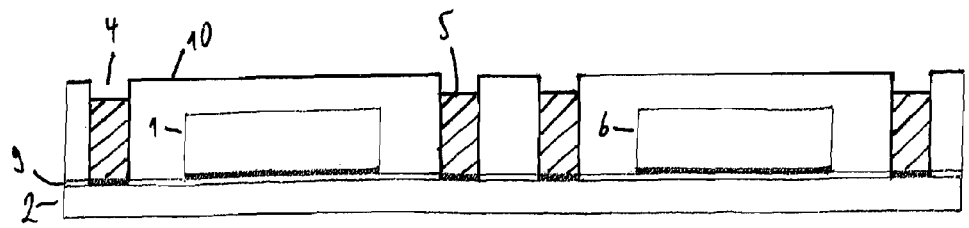
FIGS. 3A to 3F schematically illustrate a method to produce devices as a further exemplary embodiment.
Figure 3B:
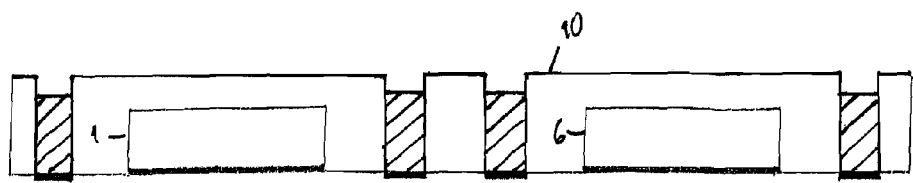
Figure 3C:
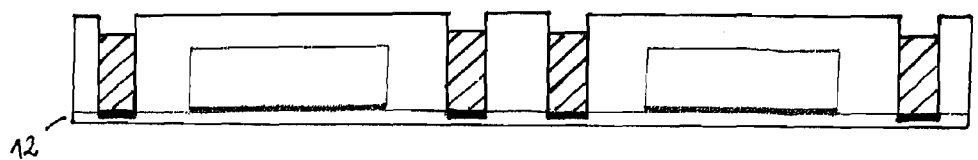
Figure 3D:
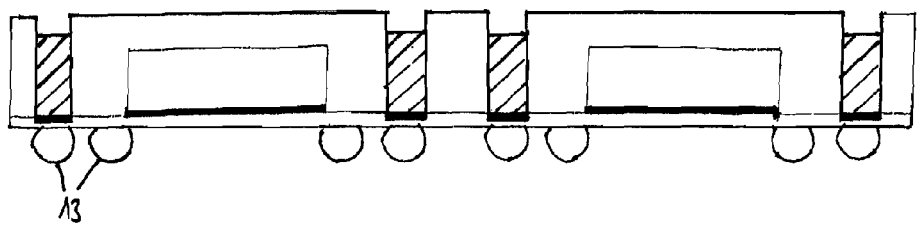
Figure 3E:
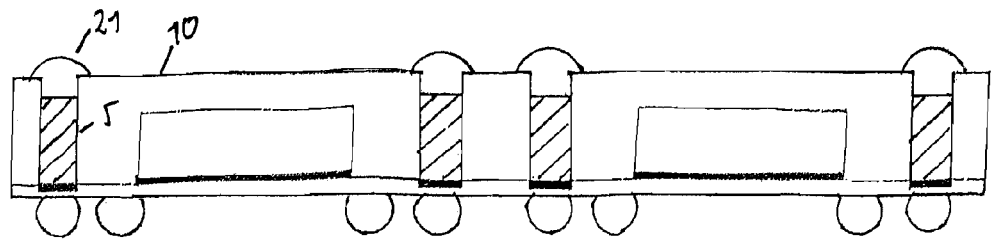
Figure 3F:
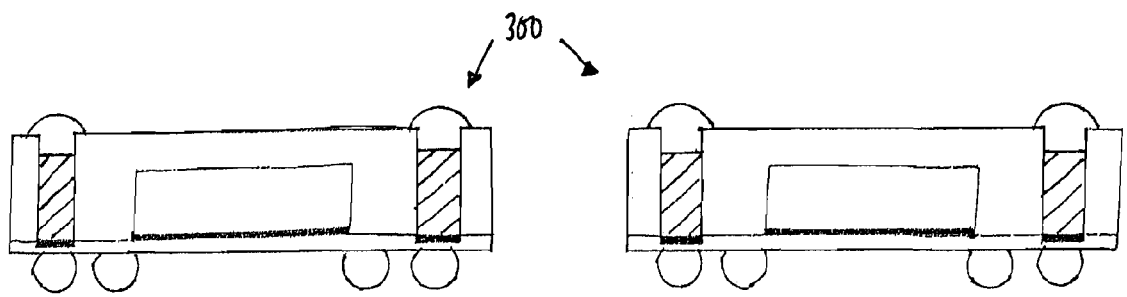

FIGS. 3A to 3F schematically illustrate a method for production of devices 300, cross sections of which are illustrated in FIG. 3F. The method illustrated in FIGS. 3A to 3F is a development of the method illustrated in FIGS. 2A to 2I. In the embodiment illustrated in FIGS. 3A to 3F the through holes 4 are not completely filled with the first material 5. For example, the galvanic deposition of the first material 5 may be stopped when the remaining parts of the through holes 4 have an aspect ratio of 1:1 or higher (see FIG. 3A).

The release of the carrier 2 and the adhesive tape 9 (see FIG. 3B), the formation of the redistribution layer 12 (see FIG. 3C) and the placement of the external contact elements 13 (see FIG. 3D) correspond to the fabrication of the devices 200 illustrated in FIGS. 2F to 2H.

As illustrated in FIG. 3E, the parts of the through holes 4 that are not filled with the first material 5 are filled with a second material 21, which may be a solder material, in particular a solder paste. The solder material 21 may, for example, be printed on the molding compound layer 10 or may be injected into the through holes 4 under pressure. The solder material 21 may be formed from metal alloys which are composed, for example, from the following materials: SnPb, SnAg, SnAgCu, SnAgCuNi, SnAu, SnCu and SnBi. The solder material 21 may be cheaper than the first material 5.

As illustrated in FIG. 3F, the two semiconductor chips 1 and 6 are separated from one another by separation of the molding compound layer 10, for example by sawing.

Figure 4:
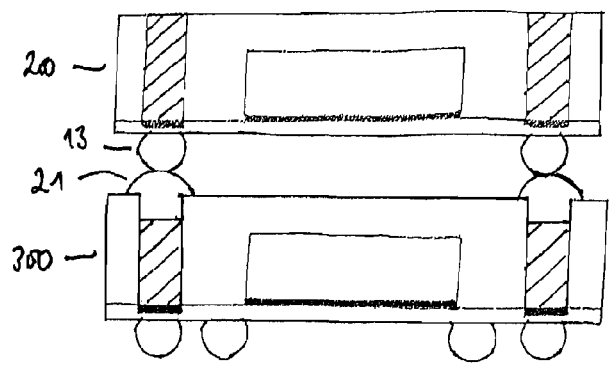
FIG. 4 schematically illustrates a device stacked on top of a device as a further exemplary embodiment.

FIG. 4 schematically illustrates a device 200 stacked on top of a device 300. The external contacts elements 13 of the device 200 are arranged such that they are in contact with the solder material 21 on the top surface of the device 300. Stacking devices on top of each other leads to a higher system integration. The electrically conductive vias in the molding compound layers 10 allow to produce short electrical connections between the devices stacked on top of each other. It is obvious to a person skilled in the art that the stacked devices 200 and 300 illustrated in FIG. 4 are only intended to be an exemplary embodiment, and many variations are possible. For example, other devices than the device 200 may be stacked on top of the device 300 and/or other devices may be stacked on top of the device 200.

In addition, while a particular feature or aspect of an embodiment of the invention may have been disclosed with respect to only one of several implementations, such feature or aspect may be combined with one or more other features or aspects of the other implementations as may be desired for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
    a semiconductor chip including an active surface, an inactive surface opposite the active surface, and side surfaces extending between the active surface and the inactive surface;
    a single molding compound layer surrounding the inactive surface and side surfaces of the semiconductor chip, wherein the active surface of the semiconductor chip and a first surface of the molding compound layer form a common plane;
    an electrically conductive layer applied to the molding compound layer;
    a through hole disposed within the molding compound layer; and
    a first electrically conductive material arranged in the through hole and being in contact with the molding compound layer.

2. The device of claim 1, wherein the electrically conductive layer covers an opening of the through hole.

3. The device of claim 1, wherein the first electrically conductive material is electrically coupled to the electrically conductive layer.

4. The device of claim 1, wherein the electrically conductive layer is applied to the active surface of the semiconductor chip and the first surface of the molding compound layer.

5. The device of claim 1, wherein the electrically conductive layer forms a redistribution layer.

6. The device of claim 1, wherein a second electrically conductive material is arranged in the through hole.

7. The device of claim 6, wherein the second electrically conductive material is solder.

8. The device of claim 6, wherein the second electrically conductive material covers a second surface of the molding compound layer partially.

9. The device of claim 8, wherein the second surface of the molding compound layer is opposite to the first surface of the molding compound layer.

10. The device of claim 6, wherein a third electrically conductive material is arranged in the through-hole.

11. The device of claim 10, wherein the third electrically conductive material is solder.

12. The device of claim 10, wherein the second electrically conductive material is arranged at one end of the through hole and the third electrically conductive material is arranged at the other end of the through hole.

13. The device of claim 1, wherein an aspect ratio of the through hole is in the range from 1:1 to 1:5.

14. The device of claim 1, wherein the through hole is aligned essentially perpendicular to the active surface of the semiconductor chip.

15. The device of claim 1, wherein the electrically conductive layer is arranged over the active surface of the semiconductor chip.

16. The device of claim 1, wherein solder deposits are attached to the electrically conductive layer.

17. The device of claim 1, wherein a first dielectric layer is arranged between the molding compound layer and the electrically conductive layer.

18. The device of claim 17, wherein the first dielectric layer has openings to form electrical contacts between the electrically conductive layer and contact pads of the semiconductor chip.

19. The device or claim 17, wherein a second dielectric layer covers the electrically conductive layer.

20. The device of claim 19, wherein a further electrically conductive layer is applied to the second dielectric layer.

21. The device of claim 20, wherein a third dielectric layer covers the further electrically conductive layer.

22. An arrangement, comprising:
a device comprising a first semiconductor chip, a single molding compound layer encapsulating an inactive surface and side surfaces of the first semiconductor chip, an electrically conductive layer applied to the molding compound layer, a through hole disposed within the molding compound layer, and a first electrically conductive material arranged in the through hole and being in contact with the molding compound layer; and
a second semiconductor chip, wherein the device and the second semiconductor chip are stacked on each other,
wherein an active surface of the first semiconductor chip and a first surface of the molding compound layer form a common plane.

23. The arrangement of claim 22, wherein the first semiconductor chip is electrically coupled to the second semiconductor chip via the first electrically conductive material arranged in the through hole of the device.

* * * * *